United States Patent
Malatkar

(10) Patent No.: US 9,818,719 B2
(45) Date of Patent: Nov. 14, 2017

(54) BUMPLESS BUILD-UP LAYER PACKAGE DESIGN WITH AN INTERPOSER

(71) Applicant: Intel Corporation, Santa Clara, CA (US)

(72) Inventor: Pramod Malatkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/972,048

(22) Filed: Aug. 21, 2013

(65) Prior Publication Data

US 2013/0334696 A1 Dec. 19, 2013

Related U.S. Application Data

(63) Continuation of application No. 12/827,323, filed on Jun. 30, 2010, now abandoned.

(51) Int. Cl.
*H01L 23/02* (2006.01)
*H01L 23/00* (2006.01)
(Continued)

(52) U.S. Cl.
CPC ............. *H01L 24/96* (2013.01); *H01L 23/13* (2013.01); *H01L 23/3128* (2013.01);
(Continued)

(58) Field of Classification Search
CPC ............. H01L 23/13; H01L 23/49827; H01L 23/3128; H01L 23/49838; H01L 2924/00014; H01L 24/06; H01L 2224/0557; H01L 2224/12105; H01L 2224/16225; H01L 2224/24226; H01L 2225/06565; H01L 2225/06572; H01L 2924/01005
See application file for complete search history.

(56) References Cited

U.S. PATENT DOCUMENTS 5,353,498 A 10/1994 Fillion et al.
5,497,033 A 3/1996 Fillion et al.
(Continued)

FOREIGN PATENT DOCUMENTS

CN 101197343 A 6/2008
EP 1 189 273 A2 3/2002
(Continued)

OTHER PUBLICATIONS

Office Action received for Korean Patent Application No. 10-2012-7031945, dated Jan. 24, 2014, 7 pages of Office Action Including 3 pages of English Translation.
(Continued)

*Primary Examiner* — Cuong B Nguyen
(74) *Attorney, Agent, or Firm* — Green, Howard & Mughal LLP.; Robert G. Winkle

(57) ABSTRACT

The present disclosure relates to the field of integrated circuit package design and, more particularly, to packages using a bumpless build-up layer (BBUL) designs. Embodiments of the present description relate to the field of fabricating microelectronic packages, wherein an interposer, such as a through-silicon via interposer, may be used in a bumpless build-up layer package to facilitate stacked microelectronic components.

17 Claims, 7 Drawing Sheets

(51) Int. Cl.
*H01L 23/13* (2006.01)
*H01L 23/31* (2006.01)
*H01L 23/498* (2006.01)
*H01L 23/538* (2006.01)
*H01L 25/065* (2006.01)
*H01L 25/18* (2006.01)

(52) U.S. Cl.
CPC .. *H01L 23/49827* (2013.01); *H01L 23/49833* (2013.01); *H01L 23/49838* (2013.01); *H01L 23/5389* (2013.01); *H01L 24/19* (2013.01); *H01L 24/20* (2013.01); *H01L 24/24* (2013.01); *H01L 25/0657* (2013.01); *H01L 25/18* (2013.01); *H01L 24/05* (2013.01); *H01L 24/06* (2013.01); *H01L 24/12* (2013.01); *H01L 24/16* (2013.01); *H01L 24/82* (2013.01); *H01L 2223/6677* (2013.01); *H01L 2224/0401* (2013.01); *H01L 2224/04105* (2013.01); *H01L 2224/0557* (2013.01); *H01L 2224/06135* (2013.01); *H01L 2224/06155* (2013.01); *H01L 2224/12105* (2013.01); *H01L 2224/16146* (2013.01); *H01L 2224/16225* (2013.01); *H01L 2224/16235* (2013.01); *H01L 2224/24195* (2013.01); *H01L 2224/24226* (2013.01); *H01L 2224/73259* (2013.01); *H01L 2225/06513* (2013.01); *H01L 2225/06517* (2013.01); *H01L 2225/06541* (2013.01); *H01L 2225/06544* (2013.01); *H01L 2225/06548* (2013.01); *H01L 2225/06565* (2013.01); *H01L 2225/06568* (2013.01); *H01L 2225/06572* (2013.01); *H01L 2924/00014* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01032* (2013.01); *H01L 2924/01033* (2013.01); *H01L 2924/01047* (2013.01); *H01L 2924/01079* (2013.01); *H01L 2924/14* (2013.01); *H01L 2924/15172* (2013.01); *H01L 2924/15192* (2013.01); *H01L 2924/15311* (2013.01); *H01L 2924/18162* (2013.01)

(56) References Cited

U.S. PATENT DOCUMENTS

| | | | |
|---|---|---|---|
| 5,527,741 | A | 6/1996 | Cole et al. |
| 5,790,384 | A | 8/1998 | Ahmad et al. |
| 5,841,193 | A | 11/1998 | Eichelberger |
| 5,977,640 | A | 11/1999 | Bertin et al. |
| 6,154,366 | A | 11/2000 | Ma et al. |
| 6,159,767 | A | 12/2000 | Eichelberger |
| 6,232,152 | B1 | 5/2001 | Distefano et al. |
| 6,239,482 | B1 | 5/2001 | Fillion et al. |
| 6,242,282 | B1 | 6/2001 | Fillion et al. |
| 6,271,469 | B1 | 8/2001 | Ma et al. |
| 6,306,680 | B1 | 10/2001 | Fillion et al. |
| 6,396,148 | B1 | 5/2002 | Eichelberger et al. |
| 6,396,153 | B2 | 5/2002 | Fillion et al. |
| 6,423,570 | B1 | 7/2002 | Ma et al. |
| 6,426,545 | B1 | 7/2002 | Eichelberger et al. |
| 6,469,395 | B1 | 10/2002 | Nishihara et al. |
| 6,489,185 | B1 | 12/2002 | Towle et al. |
| 6,555,906 | B2 | 4/2003 | Towle et al. |
| 6,555,908 | B1 | 4/2003 | Eichelberger et al. |
| 6,580,611 | B1 | 6/2003 | Vandentop et al. |
| 6,586,276 | B2 | 7/2003 | Towle et al. |
| 6,586,822 | B1 | 7/2003 | Vu et al. |
| 6,586,836 | B1 | 7/2003 | Ma et al. |
| 6,617,682 | B1 | 9/2003 | Ma et al. |
| 6,703,400 | B2 | 3/2004 | Johnson et al. |
| 6,706,553 | B2 | 3/2004 | Towle et al. |
| 6,709,898 | B1 | 3/2004 | Ma et al. |
| 6,713,859 | B1 | 3/2004 | Ma |
| 6,734,534 | B1 | 5/2004 | Vu et al. |
| 6,794,223 | B2 | 9/2004 | Ma et al. |
| 6,818,544 | B2 | 11/2004 | Eichelberger et al. |
| 6,825,063 | B2 | 11/2004 | Vu et al. |
| 6,841,413 | B2 | 1/2005 | Liu et al. |
| 6,888,240 | B2 | 5/2005 | Towle et al. |
| 6,894,399 | B2 | 5/2005 | Vu et al. |
| 6,902,950 | B2 | 6/2005 | Ma et al. |
| 6,964,889 | B2 | 11/2005 | Ma et al. |
| 7,067,356 | B2 | 6/2006 | Towle et al. |
| 7,071,024 | B2 | 7/2006 | Towle et al. |
| 7,078,788 | B2 | 7/2006 | Vu et al. |
| 7,109,055 | B2 | 9/2006 | McDonald et al. |
| 7,112,467 | B2 | 9/2006 | Eichelberger et al. |
| 7,160,755 | B2 | 1/2007 | Lo et al. |
| 7,183,658 | B2 | 2/2007 | Towle et al. |
| 7,189,596 | B1 | 3/2007 | Ma et al. |
| 7,215,033 | B2* | 5/2007 | Lee ............. H01L 23/481 257/686 |
| 7,416,918 | B2 | 8/2008 | Ma |
| 7,420,273 | B2 | 9/2008 | Liu et al. |
| 7,425,464 | B2 | 9/2008 | Fay et al. |
| 7,442,581 | B2 | 10/2008 | Lytle et al. |
| 7,476,563 | B2 | 1/2009 | Mangrum et al. |
| 7,588,951 | B2 | 9/2009 | Mangrum et al. |
| 7,595,226 | B2 | 9/2009 | Lytle et al. |
| 7,619,901 | B2 | 11/2009 | Eichelberger et al. |
| 7,632,715 | B2 | 12/2009 | Hess et al. |
| 7,648,858 | B2 | 1/2010 | Tang et al. |
| 7,651,889 | B2 | 1/2010 | Tang et al. |
| 7,655,502 | B2 | 2/2010 | Mangrum et al. |
| 7,659,143 | B2 | 2/2010 | Tang et al. |
| 8,313,958 | B2 | 11/2012 | Swaminathan et al. |
| 8,319,318 | B2 | 11/2012 | Nalla et al. |
| 8,372,666 | B2 | 2/2013 | Crawford et al. |
| 8,431,438 | B2 | 4/2013 | Nalla et al. |
| 8,535,989 | B2 | 9/2013 | Sankman et al. |
| 2002/0031867 | A1 | 3/2002 | Horiuchi et al. |
| 2003/0127737 | A1 | 7/2003 | Takahashi |
| 2005/0003619 | A1 | 1/2005 | Tanaka et al. |
| 2006/0033199 | A1 | 2/2006 | Kawakami et al. |
| 2006/0175695 | A1 | 8/2006 | Lee |
| 2007/0155048 | A1* | 7/2007 | Lee et al. ................. 438/106 |
| 2008/0029872 | A1 | 2/2008 | Hsu et al. |
| 2008/0054448 | A1 | 3/2008 | Lu et al. |
| 2008/0106934 | A1 | 5/2008 | Lee et al. |
| 2008/0128916 | A1 | 6/2008 | Soejima et al. |
| 2008/0315377 | A1 | 12/2008 | Eichelberger et al. |
| 2008/0315391 | A1 | 12/2008 | Kohl et al. |
| 2009/0072382 | A1 | 3/2009 | Guzek |
| 2009/0079063 | A1 | 3/2009 | Chrysler et al. |
| 2009/0079064 | A1 | 3/2009 | Tang et al. |
| 2009/0212416 | A1 | 8/2009 | Skeete |
| 2009/0294942 | A1 | 12/2009 | Palmer et al. |
| 2010/0044855 | A1 | 2/2010 | Eichelberger et al. |
| 2010/0047970 | A1 | 2/2010 | Eichelberger et al. |
| 2010/0133704 | A1* | 6/2010 | Marimuthu ......... H01L 21/565 257/778 |
| 2010/0163952 | A1 | 7/2010 | Jan et al. |
| 2011/0068444 | A1* | 3/2011 | Chi et al. ................. 257/669 |
| 2011/0101491 | A1 | 5/2011 | Skeete et al. |
| 2011/0108999 | A1 | 5/2011 | Nalla et al. |
| 2011/0156231 | A1 | 6/2011 | Guzek |
| 2011/0215464 | A1 | 9/2011 | Guzek et al. |
| 2011/0228464 | A1 | 9/2011 | Guzek et al. |
| 2011/0254124 | A1 | 10/2011 | Nalla et al. |
| 2012/0049382 | A1 | 3/2012 | Malatkar |

FOREIGN PATENT DOCUMENTS

| | | |
|---|---|---|
| KR | 10-2006-0028001 A | 3/2006 |
| WO | 2010/078189 A2 | 7/2010 |
| WO | 2010/078189 A3 | 9/2010 |

(56) References Cited

FOREIGN PATENT DOCUMENTS

WO  2012/003280 A2  1/2012
WO  2012/003280 A3  4/2012

OTHER PUBLICATIONS

U.S. Appl. No. 09/640,961, filed Aug. 16, 2000, 70 pages
International Search Report and Written Opinion received for PCT Patent Application No. PCT/US2009/069394, dated Jul. 26, 2010, 9 pages.
International Preliminary Report on Patentability Revived for PCT Patent Application No. PCT/US2011/042534, dated Jan. 17, 2013, 6 pages.
International Search Report and Written Opinion Received for PCT Patent Application No. PCT/US2011/042534, dated Feb. 28, 2012, 9 pages.
Office Action received for Chinese Patent Application No. 201180027611.X, dated Oct. 27, 2014, 10 pages of English Translation and 9 pages of Chinese Office Action.
Office Action received for Chinese Patent Application No. 201180027611.X, dated Dec. 17, 2015, 3 pages of Chinese Office Action only.
Extended European Search Report received for European Patent Application No. 11801390.3, dated Oct. 5, 2015, 6 pages.
Office Action received for Chinese Patent Application No. 201180027611.X, dated Jun. 17, 2015, 7 pages of Chinese Office Action only.
Office Action received for Taiwan Patent Application No. 100123125, dated Feb. 17, 2016, 5 pages of Taiwan Office Action and 1 page of English search report.
Office Action received for Taiwan Patent Application No. 100123125, dated Oct. 24, 2016, 6 Pages of Taiwan Office Action including 1 Page of English Search Report.

* cited by examiner

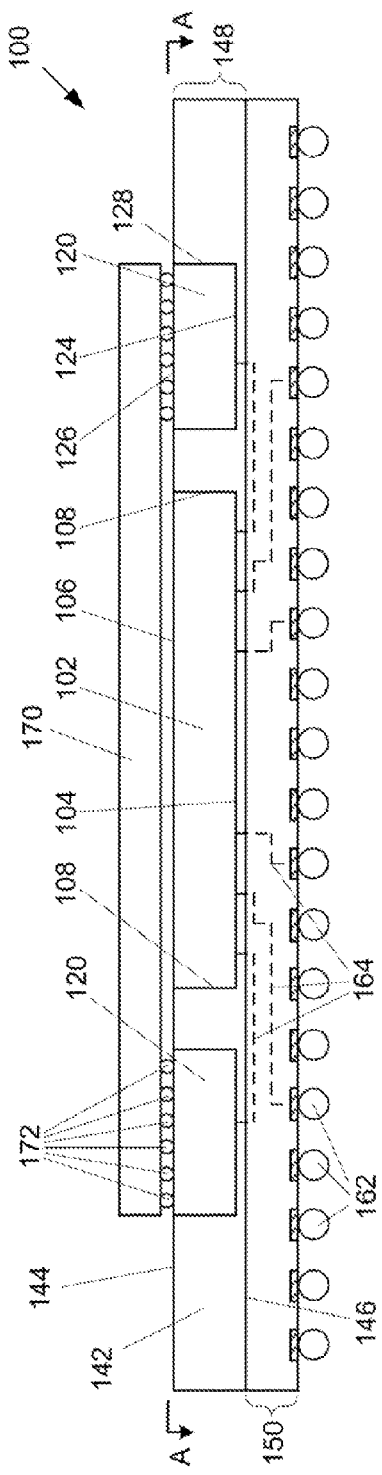
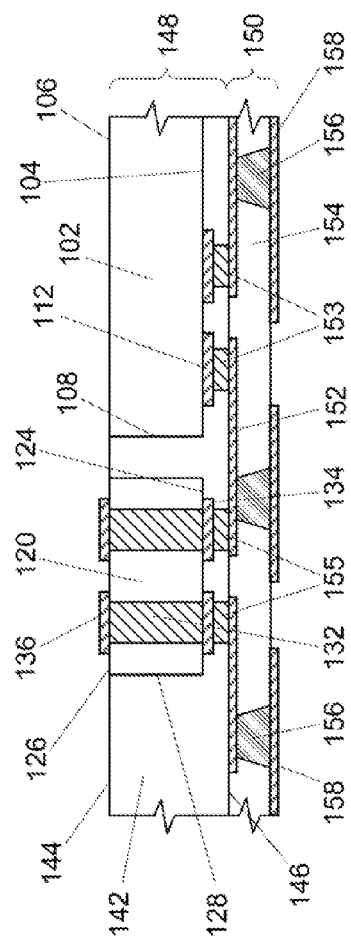
FIG. 1
FIG. 2

BUMPLESS BUILD-UP LAYER PACKAGE DESIGN WITH AN INTERPOSER

RELATED MATTERS

The present application is a continuation of U.S. patent application Ser. No. 12/827,323 filed Jun. 30, 2010 entitled "BUMPLESS BUILD-UP LAYER PACKAGE DESIGN WITH AN INTERPOSER".

BACKGROUND

Embodiments of the present description generally relate to the field of microelectronic device package designs and, more particularly, to packages using a bumpless build-up layer (BBUL) designs. With shrinking microelectronic electronic device sizes, microelectronic device packages need to occupy less space, which may be achieved by stacking microelectronic components.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 1 and 2 illustrate side cross-sectional views of an embodiment of a microelectronic package having an interposer in a bumpless build-up layer design.

DETAILED DESCRIPTION

Figure 3:
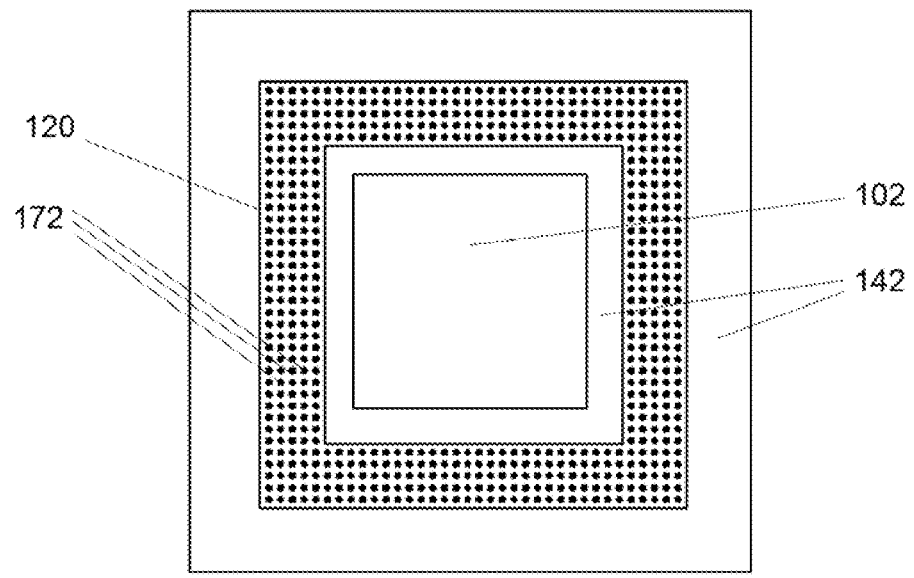
FIGS. 3 and 4 illustrate top plan views along line A-A of FIG. 1 showing embodiments of the interposer.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic packages, wherein an interposer, such as a through-silicon via interposer, may be used in a bumpless build-up layer package to facilitate stacked microelectronic components.

FIGS. 1 and 2 illustrate cross-sectional views of a bumpless build-up layer—coreless substrate technology (BBUL-C) microelectronic package having an interposer, in accordance with one embodiment of the present description. As shown, a microelectronic package 100 may include at least one microelectronic die 102, where the microelectronic die 102 includes an active surface 104, a back surface 106 that is substantially parallel to the microelectronic die active surface 104, and at least two opposing sides 108 extending from the microelectronic die active surface 104 to the microelectronic die back surface 106.

Referring to FIG. 2, the microelectronic die 102 may further include at least one contact land 112 on the microelectronic die active surface 104, wherein each microelectronic die contact land 112 may be connected to integrated circuits (not shown) within the microelectronic die 102. The microelectronic die 102 may be any appropriate integrated circuit device including but not limited to a processor or microprocessor (single or multi-core), a memory device, a chipset, a graphics device, an application specific integrated circuit, or the like. The microelectronic die contact lands 112 may be any appropriate conductive material, including but not limited to copper, aluminum, silver, gold, or alloys thereof.

The microelectronic package 100 may further include an interposer 120 positioned proximate at least one microelectronic die side 108, where the interposer 120 includes a front surface 124, an opposing back surface 126 that is substantially parallel to the interposer front surface 124, and at least one side 128 extending from the interposer front surface 124 to the interposer back surface 126, as shown in FIG. 2. The interposer 120 may have at least one conductive via 132 extending therethrough from the interposer front surface 124 to the interposer back surface 126. Each interposer conductive via 132 may have a contact land 134 on the interposer front surface 124 and a contact land 136 on the interposer back surface 126. The interposer conductive vias 132, the interposer front surface contact lands 134, the interposer back surface contact lands 136 may be fabricated by any technique know in the art, and may be made of any appropriate conductive material, including but not limited to copper, aluminum, silver, gold, or alloys thereof.

In one embodiment, the interposer 120 may be a silicon-containing material, such as amorphous silicon or silicon-germanium, or a ceramic material. In another embodiment, the interposer 120 may be the same silicon material as the predominate material in the microelectronic die 102 to minimize thermal expansion mismatch, as will be understood to those skilled in the art.

The interposer 120 may be designed such that the interposer back surface 126 is substantially planar to the microelectronic die back surface 106, and may be designed such that the interposer front surface 124 is substantially planar to the microelectronic die active surface 104. An encapsulation material 142 may be disposed adjacent the microelectronic die sides 108 and the interposer sides 128, thereby forming a substrate 148. A back surface 144 of the encapsulation material 142 may be formed to be substantially planar with the interposer back surface 126 and substantially planar with the microelectronic die back surface 106. The encapsulation material 142 may be any appropriate dielectric material, including, but not limited to silica-filled epoxies, such as are available from Ajinomoto Fine-Techno Co., Inc., 1-2 Suzuki-cho, Kawasaki-ku, Kawasaki-shi, 210-0801, Japan (Ajinomoto GX13, Ajinomoto GX92, and the like).

A build-up layer 150 may be formed on the encapsulation material front surface 146. The build-up layer 150 may comprise a plurality of dielectric layers with conductive traces formed on each dielectric layer with conductive vias extending through each dielectric layer to connect the conductive traces and/or other microelectronic components on different layers. Referring to FIG. 2, the build-up layer 150 may comprise at least one first layer conductive trace 152 connected to at least one microelectronic die contact land 112 and/or at least one interposer front surface contact land 134 through a trace-to-microelectronic die conductive via 153 and a trace-to-interposer conductive via 155, respectively, formed through the encapsulation material 142. A dielectric layer 154 may be formed adjacent at least one first layer conductive trace 152 and encapsulation material front surface 146. At least one conductive via 156 may extend through the dielectric layer 154 to connect at least one first layer conductive trace 152 to at least one second layer conductive trace 158. The build-up layer 150 may be used to connect the microelectronic die 102 to the interposer 120 or to connect the microelectronic die 102 to external interconnects 162 (shown in FIG. 1). These connections are shown as dashed lines 164 in FIG. 1. The external interconnects 162 may be solder balls (as shown in FIG. 1) or pins (not shown) and may be used to connect the microelectronic package 100 to external devices (not shown).

It is understood that although only one dielectric layer and two conductive trace layers are shown, the build-up layer 150 may be any appropriate number of dielectric layers and conductive trace layers. The dielectric layer(s), such as the dielectric layer 154, may formed by any technique known in the art and may be formed from any appropriate dielectric material. The conductive trace layers, such as first layer conductive trace 152 and the second layer conductive trace 158, and the conductive vias 156, may be fabricated by any technique known in the art, and may be made of any appropriate conductive material, including but not limited to copper, aluminum, silver, gold, or alloys thereof.

As shown in FIG. 1, a stacked microelectronic die 170 may be attached to the interposer 120 through a plurality of interconnects 172 (shown as solder balls). The stacked microelectronic die 170 may extend over the microelectronic die back surface 106 and be attached to the interposer 120 on an opposing side of the microelectronic die 102. The stacked microelectronic die 170 may be any appropriate integrated circuit device including but not limited to a processor or microprocessor (single or multi-core), a memory device, a chipset, a graphics device, an application specific integrated circuit, or the like. In one embodiment, the microelectronic die 102 is a microprocessor and the stacked microelectronic die 170 is a memory device.

Figure 4:
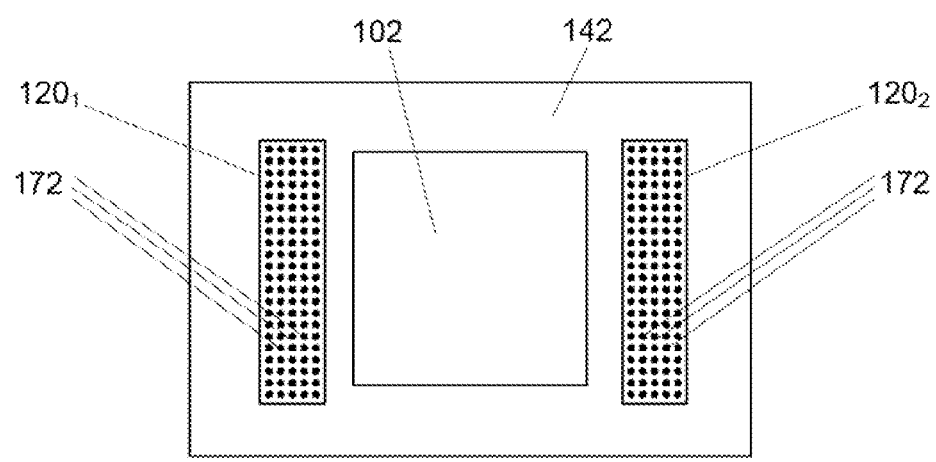

As shown in FIG. 3, the interposer 120 may surround the microelectronic die 102, and may have the interconnects 172 dispersed on all sides of the interposer 120. As shown in FIG. 4, the interposer 120 may be two separate sections (shown as elements $120_1$ and $120_2$) on opposing sides of the microelectronic die 102.

Figure 5:
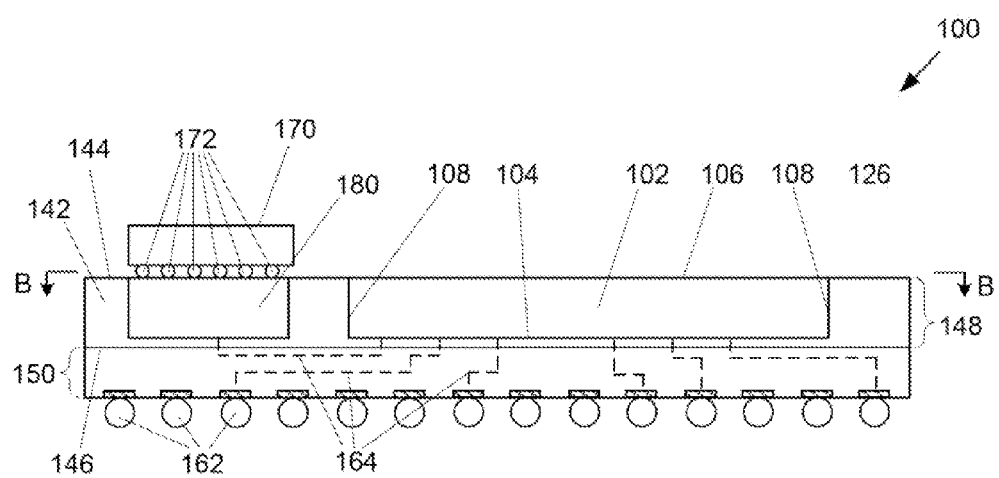
FIG. 5 illustrates a side cross-sectional view of another embodiment of a microelectronic package having an interposer in a bumpless build-up layer design.
Figure 6:
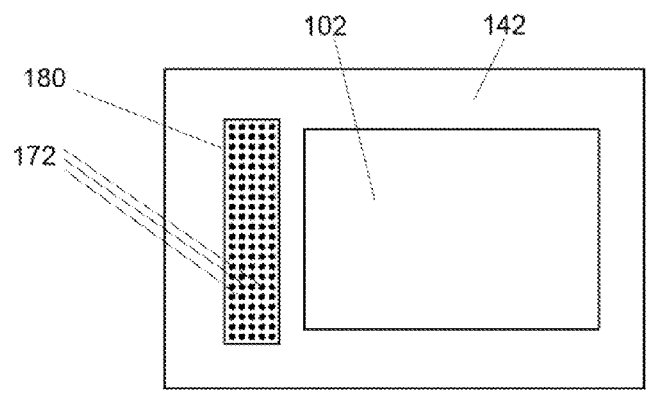
FIG. 6 illustrates a top plan views along line B-B of FIG. 5 showing an embodiment of the interposer.

It is understood that the stacked microelectronic die 170 need not span the microelectronic die 102, as shown in FIG. 1. FIGS. 5 and 6 illustrate an embodiment of the present description wherein an interposer 180 may be positioned on one side 108 of the microelectronic die 102 in the manner described with regard to the embodiments of FIGS. 1-4. Referring to FIG. 5, the stacked microelectronic die 170 may be attached to the interposer 180 through the plurality of interconnects 172 (shown as solder balls).

Figure 7:
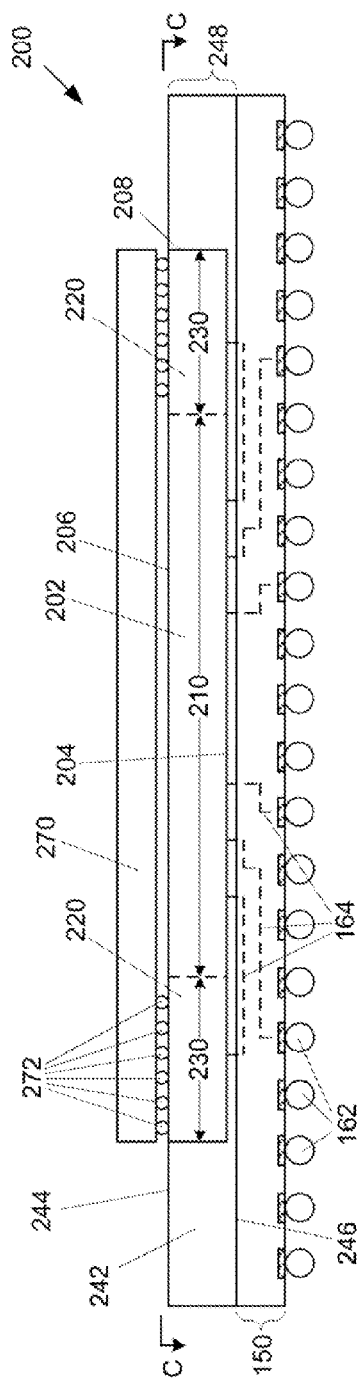
FIGS. 7 and 8 illustrate side cross-sectional views of an embodiment of a microelectronic package having an interposer integrated with a microelectronic die in a bumpless build-up layer design.
Figure 8:
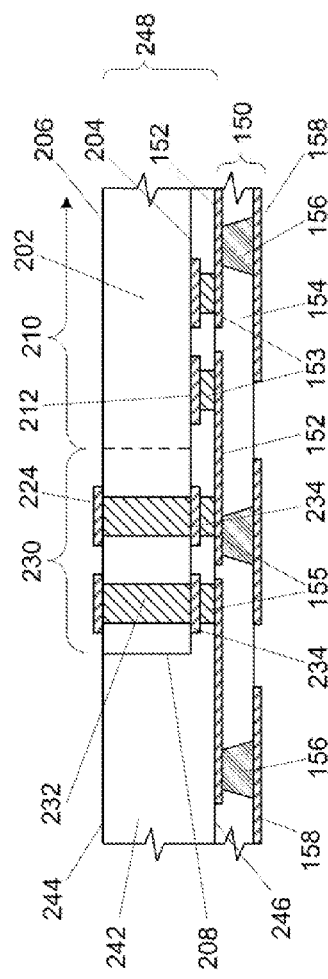

FIGS. 7 and 8 illustrate cross-sectional views of a bumpless build-up layer—coreless substrate technology (BBUL-C) microelectronic package having an interposer integrated with the microelectronic die, in accordance with another embodiment of the present description. As shown in FIG. 7, a microelectronic package 200 may include at least one microelectronic die 202, where the microelectronic die 202 includes an active surface 204, a back surface 206 that is substantially parallel to the microelectronic die active surface 204, and at least two opposing sides 208 extending from the microelectronic die active surface 204 to the microelectronic die back surface 206. The microelectronic die 202 may have an active area 210 in a central portion of the microelectronic die 202, where integrated circuits are formed, as will be understood to those skilled in the art. The microelectronic die 202 may further include an interposer area 230 between the microelectronic die active area 210 and at least one microelectronic die side 208, and may be an area where no integrated circuitry (not shown) is formed. The interposer area 230 may be the street area of a microelectronic wafer, as will be understood to those skilled in the art, or may be accommodated by enlarging the size of the microelectronic die 202.

Referring to FIG. 8, the microelectronic die 202 may further include at least one contact land 212 on the microelectronic die active surface 204 within the microelectronic die active area 210, wherein the microelectronic die contact lands 212 may be connected to integrated circuits (not shown) within the microelectronic die 202. The microelectronic die 202 may be any appropriate integrated circuit device including but not limited to a processor or microprocessor (single or multi-core), a chipset, a graphics device, an application specific integrated circuit, or the like. The microelectronic die contact lands 212 may be any appropriate conductive material, including but not limited to copper, aluminum, silver, gold, or alloys thereof.

An interposer 220 may be formed within the interposer area 230. The interposer 220 may have at least one conductive via 232 extending from the microelectronic die active surface 204 to the microelectronic die back surface 206. Each interposer conductive via 232 may have a contact land 234 on the microelectronic die active surface 204 and a contact land 236 on the microelectronic die back surface 206. The interposer conductive vias 232, the interposer front surface contact land 234, and the interposer back surface contact land 236 may be fabricated by any technique know in the art, and may be made of any appropriate conductive material, including but not limited to copper, aluminum, silver, gold, or alloys thereof.

An encapsulation material 242 may be disposed adjacent the sides 208 of the microelectronic die 202, thereby forming a substrate 248. A back surface 244 of the encapsulation material 242 may be formed to be substantially planar with the microelectronic die back surface 206. As previously described with regard to the encapsulation material 142 of FIGS. 1-6, the encapsulation material 242 may be any appropriate dielectric material, including, but not limited to silica-filled epoxies, such as are available from Ajinomoto Fine-Techno Co., Inc., 1-2 Suzuki-cho, Kawasaki-ku, Kawasaki-shi, 210-0801, Japan (Ajinomoto GX13, Ajinomoto GX92, and the like).

The build-up layer 150 may be formed on the encapsulation material front surface 246 in the same manner as described for FIGS. 1 and 2. Referring to FIG. 6, the build-up layer 150 may be used to connect the microelectronic die contact lands 212 to the interposer front surface contact lands 234 or to connect the microelectronic die 202 to external interconnects 162 (see FIG. 5). These connections are shown as dashed lines 164 in FIG. 7. The external interconnects 162 may be solder balls (as shown in FIG. 5) or pins (not shown) and may be used to connect the microelectronic package 200 to external devices (not shown).

As shown in FIG. 7, a stacked microelectronic die 270 may be attached to the interposer 220 through a plurality of interconnects 272 (shown as solder balls). The stacked microelectronic die 270 may extend over the microelectronic die back surface 206 and be attached to the interposer 220 on an opposing side of the microelectronic die 202. In one embodiment, the microelectronic die 202 is a microprocessor and the stacked microelectronic die 270 is a memory device.

Figure 9:
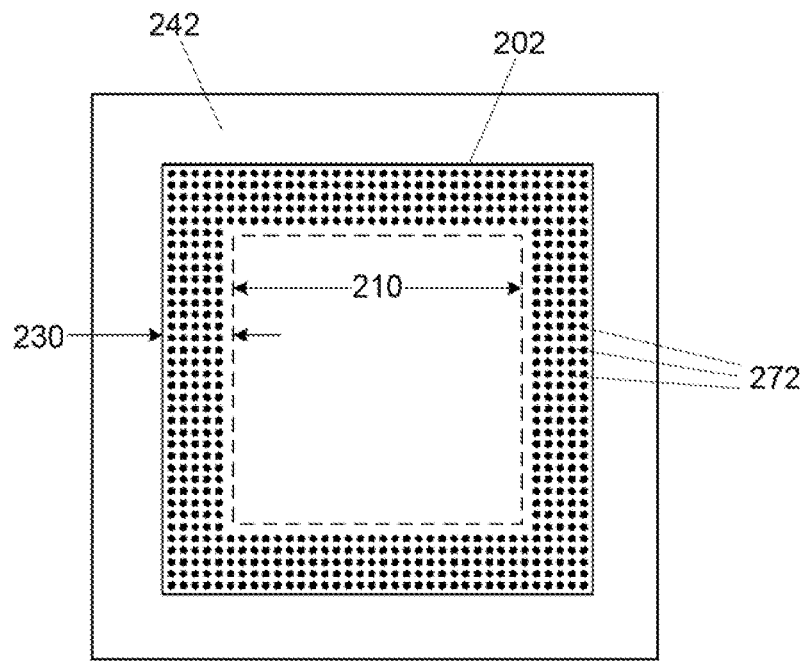
FIGS. 9 and 10 illustrate top plan views along line C-C of FIG. 7 showing embodiments of the interposer incorporated into the microelectronic die.
Figure 10:
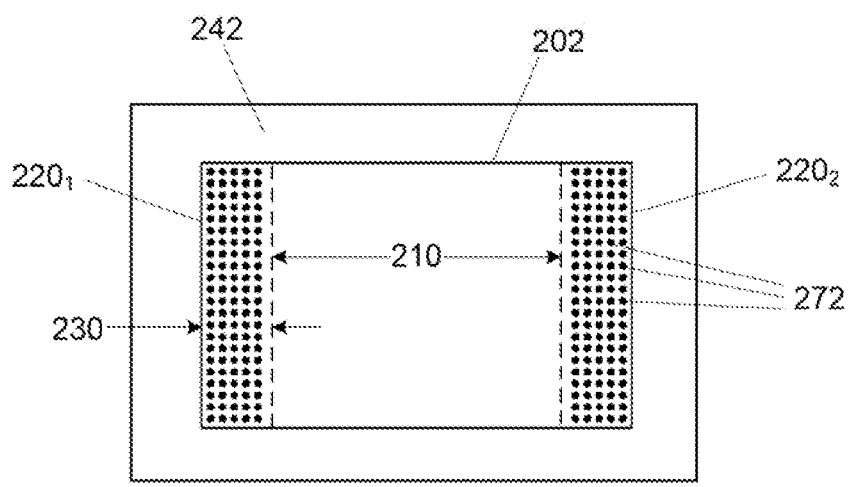

As shown in FIG. 9, the interposer 220 may surround the microelectronic die 202, and may have the plurality of interconnects 272 dispersed on all sides of the interposer 220. As shown in FIG. 10, the interposer 220 may be two separate sections (shown as elements $220_1$ and $220_2$) on opposing sides of the microelectronic die 202.

Figure 11:
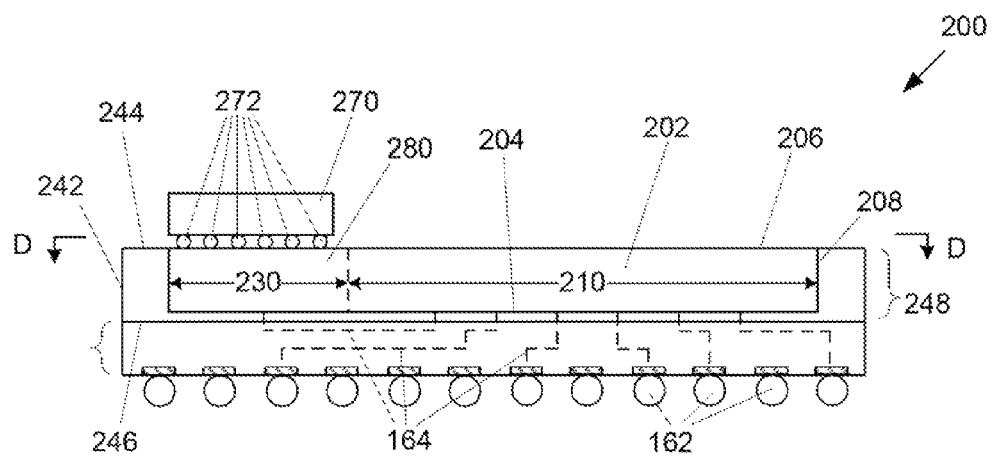
FIG. 11 illustrates a side cross-sectional view of another embodiment of a microelectronic package having an interposer integrated with a microelectronic die in a bumpless build-up layer design.
Figure 12:
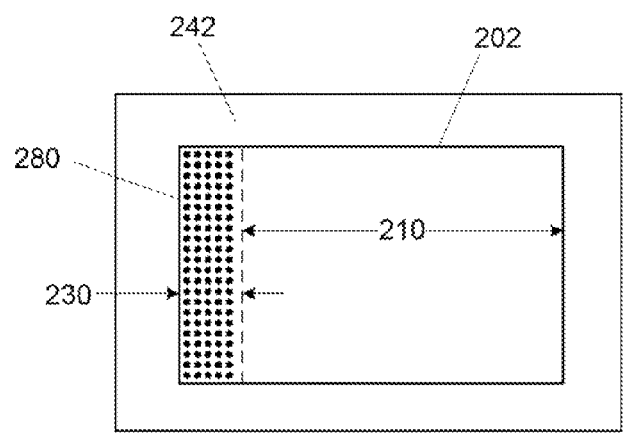
FIG. 12 illustrates a top plan views along line D-D of FIG. 11 showing an embodiment of the interposer integrated with the microelectronic die.

It is understood that the stacked microelectronic die 270 need not span the microelectronic die 102. FIGS. 11 and 12 illustrate an embodiment of the present description wherein an interposer 280 may be formed on one side 208 of the microelectronic die 202 in the manner described with regard to the embodiments of FIGS. 7-10. Referring to FIG. 11, the stacked microelectronic die 270 may be attached to the interposer 280 through the plurality of interconnects 272 (shown as solder balls).

It is understood that the interposer of the present description may result in a high-interconnection density (e.g. greater than about 30 per square millimeter) between the microelectronic dice 102 and 202 and the stacked microelectronic dice 170 and 270, while minimizing the impact to silicon layer design rules and processes. Furthermore, although the stacked microelectronic dice 170 and 270 are shown as a single die, they may be pre-stacked dice, as will be understood by those skilled in the art.

Figure 13:
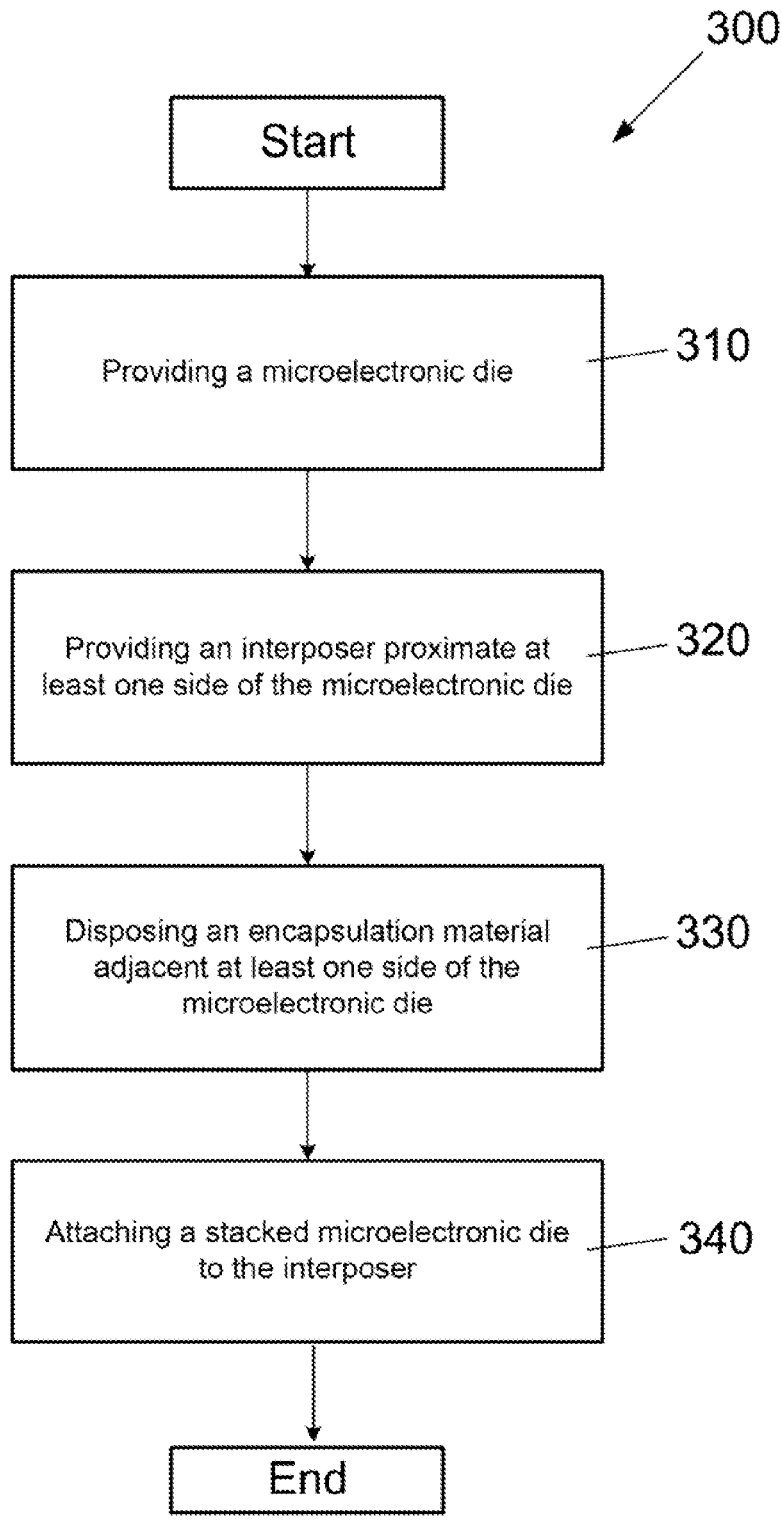
FIG. 13 is a flow diagram of one embodiment of a process of incorporating an interposer into a microelectronic package.

An embodiment of a process 300 of the present description is illustrated in FIG. 13. As defined in block 310, a microelectronic die may be provided. An interposer may be provided proximate at least one side of the microelectronic die, as defined in block 320. An encapsulation material may be disposed adjacent at least one side of the microelectronic die, as defined in block 330. As defined in block 340, a stacked microelectronic die may be attached to the interposer.

It is also understood that the subject matter of the present description is not necessarily limited to specific applications illustrated in FIGS. 1-13. The subject matter may be applied to other stacked die applications. Furthermore, the subject matter may also be used in any appropriate application outside of the microelectronic device fabrication field.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A microelectronic package comprising:
   a microelectronic die having an active surface, an opposing back surface, and at least two opposing sides extending between the microelectronic die active surface and the microelectronic die back surface, wherein the microelectronic die comprises a single structure formed of a single substrate material which includes an active area and an interposer area, wherein the active area includes in a central portion thereof further including integrated circuits formed therein and wherein the interposer area has no integrated circuits formed;
   an interposer formed within the interposer area of the microelectronic die proximate the at least one microelectronic die side;
   a build-up layer formed proximate the microelectronic die active surface, wherein the interposer area is in electrical communication with the microelectronic die active area through the build-up layer;
   an encapsulation material adjacent the at least one microelectronic die side; and
   a stacked microelectronic die attached to the interposer, wherein the encapsulation material includes a back surface that is coplanar to the microelectronic die back surface.

2. The microelectronic package of claim 1, wherein the stacked microelectronic die substantially spans the microelectronic die.

3. The microelectronic package of claim 1, wherein the interposer is proximate the at least two opposing microelectronic die sides.

4. The microelectronic package of claim 1, wherein the interposer substantially surrounds the active area of the microelectronic die.

5. The microelectronic package of claim 1, wherein the interposer includes a front surface and a back surface and wherein the encapsulation material back surface is substantially planar to the interposer back surface.

6. The microelectronic package of claim 1, wherein the microelectronic die comprises a microprocessor, and wherein the stacked microelectronic die comprises a memory device.

7. A method of forming a microelectronic package, comprising:
   forming a microelectronic die having an active surface, an opposing back surface, and at least two opposing sides extending between the microelectronic die active surface and the microelectronic die back surface, wherein the microelectronic die comprises a single structure formed of a single substrate material which includes an active area and an interposer area, wherein the active area includes in a central portion thereof further including integrated circuits formed therein and a wherein the interposer area has no integrated circuits formed therein;
   forming an interposer within the interposer area of the microelectronic die proximate at least one microelectronic die side;
   forming a build-up layer proximate the microelectronic die active surface, wherein the interposer area is in electrical communication with the microelectronic die active area through the build-up layer;
   disposing an encapsulation material adjacent the at least one side of the microelectronic die; and
   attaching a stacked microelectronic die to the interposer, wherein disposing the encapsulation material includes disposing the encapsulation material to form a back surface that is coplanar to the microelectronic die back surface.

8. The method of claim 7, wherein attaching the stacked microelectronic die comprises attaching the stacked microelectronic die to the interposer to span an active area of the microelectronic die.

9. The method of claim 7, wherein providing the interposer comprises providing the interposer proximate the at least two opposing microelectronic die sides.

10. The method of claim 7, wherein providing the interposer comprises providing the interposer which substantially surrounds an active area of the microelectronic die.

11. The method of claim 7, wherein providing the interposer comprises providing an interposer including a front surface and a back surface, and wherein disposing the encapsulation material comprises disposing the encapsulation material to form a back surface that is substantially planar to the interposer back surface.

12. The method of claim 7, wherein the microelectronic die comprises a microprocessor and the stacked microelectronic die comprises a memory device.

13. A microelectronic package comprising:
   a microelectronic die having an active surface, an opposing back surface, and at least two opposing sides extending between the microelectronic die active surface and the microelectronic die back surface, wherein the microelectronic die comprises a single structure formed of a single substrate material which includes an active area and an interposer area, wherein the active area includes in a central portion thereof further including integrated circuits formed therein and wherein the interposer area has no integrated circuits formed therein;
   an interposer formed within the interposer area of the microelectronic die proximate the at least one microelectronic die side, wherein the interposer includes a front surface and a back surface;
   a build-up layer formed proximate the microelectronic die active surface, wherein the interposer area is in electrical communication with the microelectronic die active area through the build-up layer;
   an encapsulation material adjacent the at least one microelectronic die side, wherein the encapsulation material includes a back surface that is substantially planar to the interposer back surface and substantially planar to the microelectronic die back surface;

and a stacked microelectronic die attached to the interposer, wherein the encapsulation material includes a back surface that is coplanar to the microelectronic die back surface.

14. The microelectronic package of claim 13, wherein the stacked microelectronic die substantially spans the microelectronic die.

15. The microelectronic package of claim 13, wherein the interposer is proximate the at least two opposing microelectronic die sides.

16. The microelectronic package of claim 13, wherein the interposer substantially surrounds the active area of the microelectronic die.

17. The microelectronic package of claim 13, wherein the microelectronic die comprises a microprocessor, and wherein the stacked microelectronic die comprises a memory device.

* * * * *